United States Patent [19]
Liaw et al.

[11] Patent Number: 5,998,249
[45] Date of Patent: Dec. 7, 1999

[54] STATIC RANDOM ACCESS MEMORY DESIGN AND FABRICATION PROCESS FEATURING DUAL SELF-ALIGNED CONTACT STRUCTURES

[75] Inventors: Jhon-Jhy Liaw, Taipei; Jin-Yuan Lee, Hsin-Chu, both of Taiwan

[73] Assignee: Taiwan Semiconductor Manufacturing Company Ltd., Hsin-Chu, Taiwan

[21] Appl. No.: 09/086,822

[22] Filed: May 29, 1998

[51] Int. Cl.⁶ .............................................. H01L 21/8244
[52] U.S. Cl. .................. 438/238; 438/382; 148/DIG. 20
[58] Field of Search ..................... 438/238, 382; 148/DIG. 20

[56] References Cited

U.S. PATENT DOCUMENTS

| 5,545,584 | 8/1996 | Wuu et al. | 437/52 |
| 5,573,980 | 11/1996 | Yoo | 437/200 |
| 5,607,879 | 3/1997 | Wuu et al. | 437/193 |
| 5,652,174 | 7/1997 | Wuu et al. | 437/60 |
| 5,763,303 | 6/1998 | Liaw et al. | 438/382 |
| 5,770,496 | 6/1998 | Roberts | 438/382 |

*Primary Examiner*—Jey Tsai
*Attorney, Agent, or Firm*—George O. Saile; Stephen B. Ackerman

[57] ABSTRACT

A method for forming an SRAM cell, on a semiconductor substrate, comprised of MOSFET devices, and polysilicon load resistors, has been developed. The process for forming the SRAM cell features the use of two, self-aligned contact, (SAC), structures, a polycide SAC structure, used for contact to a source region of a MOSFET pull down transistor, and a tungsten SAC structure, used for contact to a source region of a MOSFET pass gate transistor. A buried contact region is also featured in this SRAM design and fabrication procedure, used to connect underlying active device regions, of MOSFET pull down transistors, and MOSFET pass gate transistors.

31 Claims, 11 Drawing Sheets

STATIC RANDOM ACCESS MEMORY DESIGN AND FABRICATION PROCESS FEATURING DUAL SELF-ALIGNED CONTACT STRUCTURES

BACKGROUND OF THE INVENTION (1) Field of the Invention

The present invention relates to processes used to fabricate semiconductor devices, and more specifically to a process used to create a design for a static random access memory, (SRAM), cell, featuring two self-aligned contact, (SAC), structures, and featuring a buried contact region, and a butt contact structure, used to connect a load resistor to an active device region.

(2) Description of Prior Art

Static random access memory, (SRAM), cells are usually designed to include six, metal oxide semiconductor field effect transistors, (MOSFET), usually four N channel, and two P channel, MOSFETs, or four N channel MOSFET devices, and two load resistors. The SRAM performance and cost objectives have been successfully addressed by the ability of the semiconductor industry to fabricate SRAM devices, using sub-micron features. The smaller features result in a decrease in performance degrading capacitances and resistances, while also allowing a greater number of smaller SRAM chips, to be obtained from a specific size starting substrate, thus reducing the manufacturing cost of a specific SRAM chip.

In addition to the advent of micro-miniaturization, or the use of sub-micron features, specific processes and structures, used for advanced SRAM devices, have been developed. For example self-aligned contact (SAC), structures have been used for metal or polysilicon contact, to source/drain regions, located in the semiconductor substrate, used for the SRAM device. The SAC structure is designed to overlap gate structures, encapsulated with silicon nitride, thus allowing a minimum space to be allotted for the source/drain region, located between gate structures, thus allowing smaller, higher performing SRAM devices to be realized.

This invention will describe a design of, and a process for, a SRAM cell, featuring four MOSFET devices and two polysilicon load resistors. Featured in this invention will be the use of two, SAC structures, one SAC structure, comprised of a polycide, (metal silicide—polysilicon, used to contact a source region of a pull down transistor, while a second SAC structure, comprised of a metal, is used to contact a source region of a pass gate transistor. The use of two SAC structures, results in an increase in performance, as well as a decrease in area, when compared to counterparts fabricated using only one SAC structure. In addition this invention will also feature the use of a buried contact region, under a polysilicon gate structure, and a butted contact structure, to the polysilicon gate structure, allowing contact of a polysilicon load resistor to the underlying active device region. Prior art, such as Yoo, in U.S. Pat. No. 5,573,980, Wuu, et al, in U.S. Pat. No. 5,545,584, Wuu, et al, in U.S. Pat. No. 5,652,174, and Wuu, et al, in U.S. Pat. No. 5,607,879, show a SAC structure, polysilicon load resistors, and buried contact regions. However none of the prior art, or a combination of the prior art, describe the unique combination of features described in this invention, including one polysilicon SAC structure, one metal SAC structure, and the combination of a buried contact region, and a butted contact, used for communication between a polysilicon load resistor and an underlying active device region.

SUMMARY OF THE INVENTION

It is an object of this invention to create a SRAM cell, comprised of four MOSFET devices, and two polysilicon load resistors, on a semiconductor substrate.

It is another object of this invention to use two SAC structures, one comprised of polycide, (metal silicide—polysilicon), contacting a source/drain region of a pull down, MOSFET device, while the second SAC structure is comprised of metal, contacting a source/drain region of a pass gate, MOSFET device.

It is still another object of this invention to use a buried contact region, in the semiconductor substrate, to connect a source/drain region of a pull down, MOSFET device, to a source/drain region of a pass gate, MOSFET device. structure.

It is still yet another object of this invention, to use a butted contact structure, comprised of polysilicon, to connect a polysilicon load resistor to MOSFET active device regions.

In accordance with the present invention a method for creating a SRAM cell, featuring two SAC structures, a buried contact region, and a butted contact structure, has been developed. After formation of a buried contact region, in a semiconductor substrate, a gate insulator layer is grown, followed by the creation of silicon oxide capped, gate structures, with one gate structure overlying the buried contact region. Lightly doped source/drain regions, silicon oxide spacers, on the sides of the gate structures, and heavily doped source/drain regions, are next formed. A first interpolysilicon, (IPO), layer, comprised of a an overlying silicon oxide layer, and an underlying silicon nitride layer, is next deposited, followed by the creation of a first SAC opening, in the composite insulator layer, exposing a source/drain region, between two gate structures that are used as components of pull down, MOSFET devices. Deposition, and patterning, of a metal silicide layer, and of an underlying polysilicon layer, result in the creation of the first SAC structure. A second IPO layer, comprised of silicon oxide, is deposited, followed by a patterning procedure, creating a butted contact opening, in second IPO layer, in first IPO layer, and in a capping silicon oxide layer, exposing the polycide component of the gate structure. that overlays the buried contact region. An undoped polysilicon layer is deposited, and patterned, creating polysilicon load resistors, and creating a polysilicon butted contact structure, contacting the polycide layer, exposed in the butted contact opening. A third IPO layer is deposited and reflowed, followed by the creation of a second SAC opening, formed in the third IPO layer, in the second IPO layer, and in the first IPO layer, exposing a source/drain region, between two gate structures that are used as components of pass gate, MOSFET devices. A barrier layer, and a tungsten layer are then deposited and patterned, creating the second SAC structure. A metal interconnect structure, is next formed, contacting the top surface of the second SAC structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The process for creating a SRAM cell, featuring two SAC structures, and featuring a buried contact region, and a butted contact structure, contacting a polycide gate structure which overlays the buried contact region, will now be described in detail. The SRAM cell, described in this invention, will be comprised of four, N channel, MOSFET devices, and two load resistors. However this invention can also be applied to SRAM designs comprised of four, N channel MOSFET devices, and two P channel MOSFET devices.

Figure 1A:
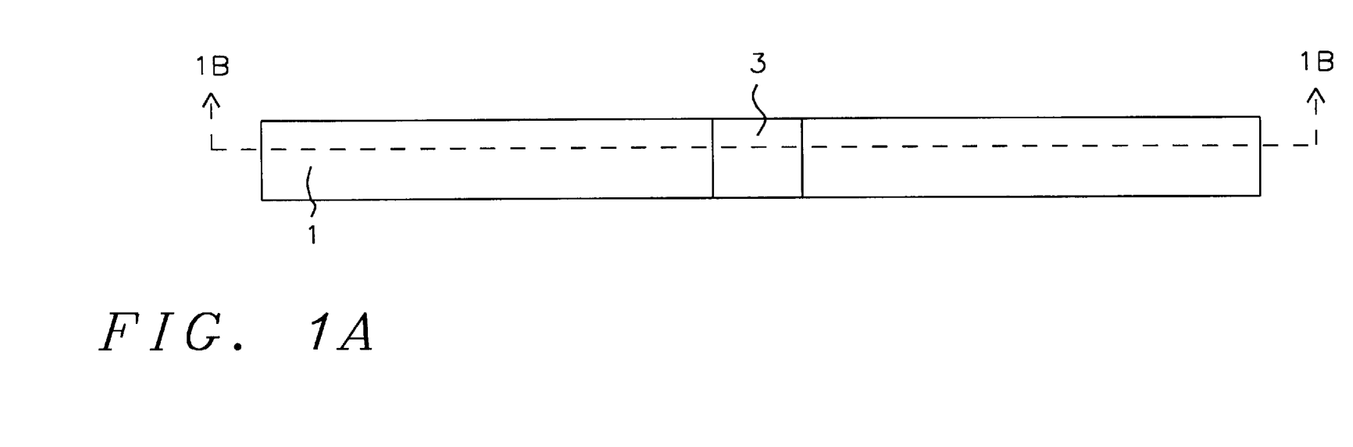
FIGS. 1A, 2A, 7A, and 12A, which schematically show the top view of the SRAM cell, at key stages of fabrication.
Figure 1B:
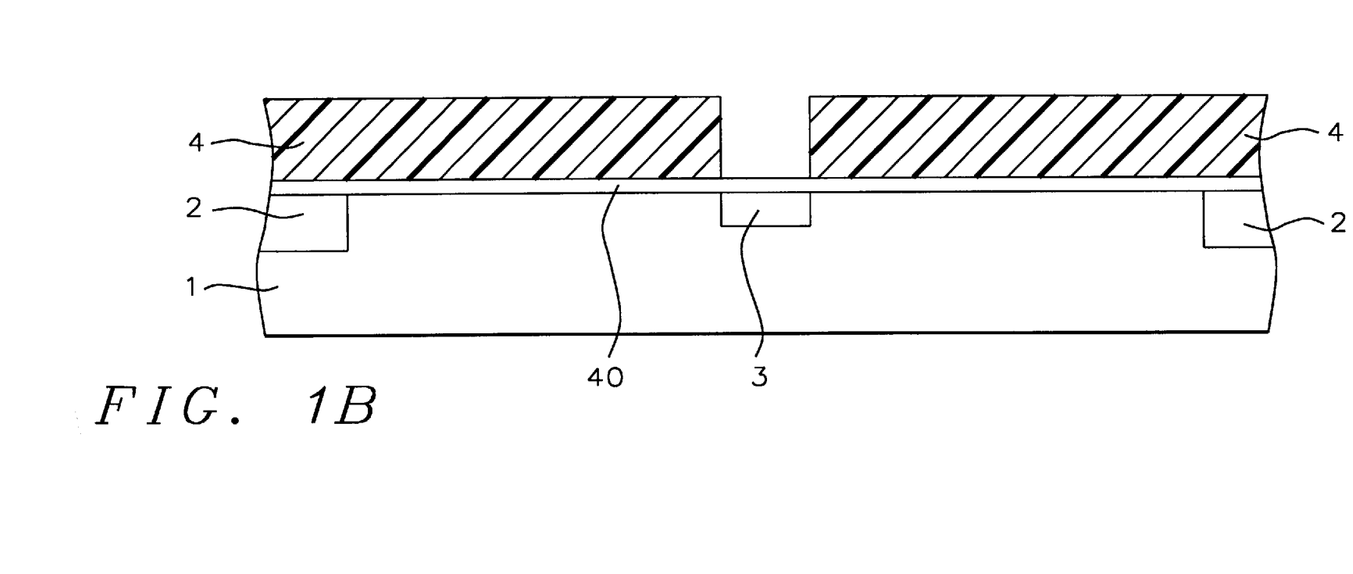
FIGS. 1B, 2B, 3–6, 7B, 8–11, 12B, and 13, which schematically, in cross-sectional style, show key stages of fabrication used to create the SRAM cell, an SAC structures.

FIG. 1A, schematically shows a top view, while FIG. 1B, schematically shows a cross-sectional view of a subsequent SRAM cell, at an early stage of fabrication. A P type, semiconductor substrate 1, comprised of single crystalline silicon, with a <100>crystallographic orientation, is shown. Isolation regions 2, either insulator filled, shallow trenches, or field oxide regions, are next formed. Field oxide (FOX), regions would be formed via thermal oxidation procedures, to a thickness between about 3000 to 5000 Angstroms. Subsequent device regions are protected from the FOX oxidation procedure by oxidation resistant masking patterns, comprised of a silicon nitride—silicon oxide composite masking layer. If insulator filled shallow trenches are used for isolation regions 2, the process comprises photolithographic and reactive ion etching, (RIE), procedures, resulting in the creation of shallow trenches, between about 3000 to 5000 Angstroms in depth, in semiconductor substrate 1, followed by the deposition of silicon oxide layer, via a low pressure chemical vapor deposition, (LPCVD), or a plasma enhanced chemical vapor deposition, (PECVD), procedure, completely filling the shallow trenches. Unwanted silicon oxide is then removed using either chemical mechanical polishing, (CMP), or using a selective, RIE procedure, resulting in the insulator filled shallow trenches. The formation of buried contact region 3, is next addressed. A thin screen oxide layer 40, comprised of either thermally grown silicon dioxide, or LPCVD or PECVD silicon oxide, is formed on semiconductor substrate 1, to a thickness between about 200 to 500 Angstroms. Photoresist shape 41, is formed, and used as mask to allow implantation of arsenic or phosphorous ions, at an energy between about 30 to 100 KeV, at a dose between about 1E14 to 3E15 atoms/cm$^2$, to be performed, creating buried contact region 3, shown schematically in FIGS. 1A and 1B.

Figure 2A:
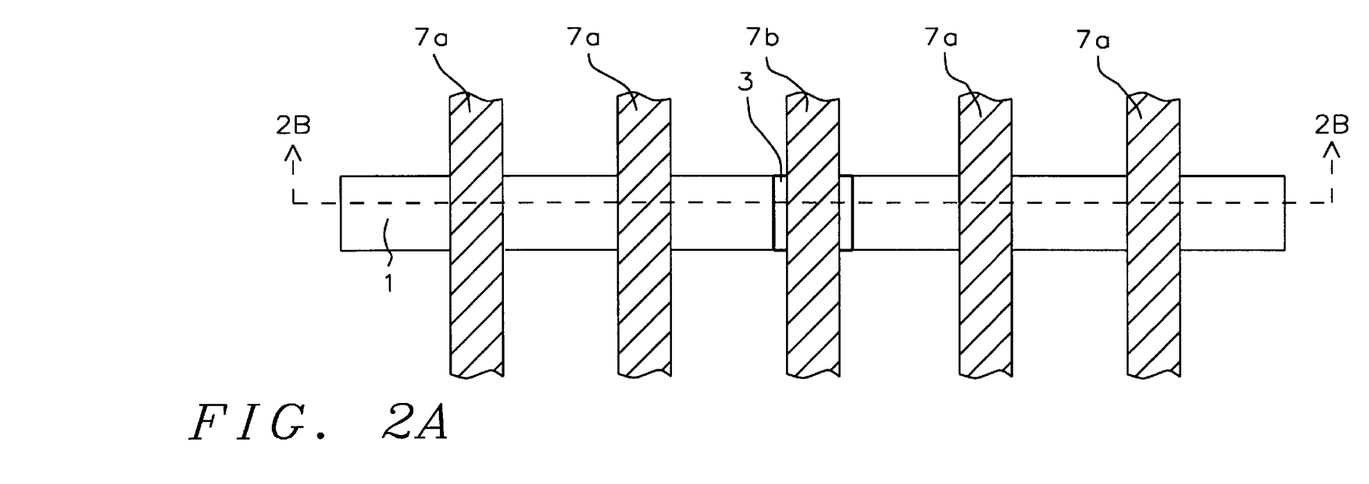
Figure 2B:
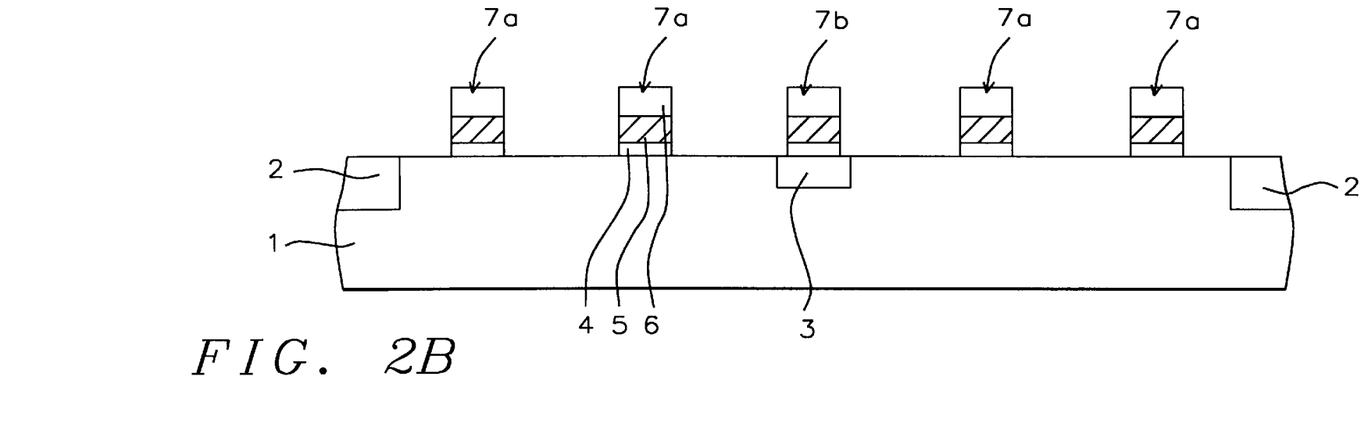

Photoresist shape 41, is next removed via plasma oxygen ashing, followed by the removal of screen oxide 40, using a buffered hydrofluoric acid solution. A gate insulator layer 4, comprised of a silicon dioxide layer, is then thermally grown, in an oxygen—steam ambient, at a temperature between about 800 to 1000° C., to a thickness between about 35 to 200 Angstroms. Next a layer of polysilicon 5, is deposited using LPCVD procedures, at a temperature between about 500 to 700° C., to a thickness between about 500 to 1500 Angstroms. Polysilicon layer 5, can be in situ doped during deposition, via the addition of phosphine, or arsine, to a silane ambient, or polysilicon layer 5, can be deposited intrinsically and doped via an ion implantation procedure, using arsenic or phosphorous ions. In addition polysilicon layer 5, can be replaced, if lower word line resistance is desired, by a polycide layer, comprised of a metal silicide, such as tungsten silicide or titanium silicide, on a polysilicon layer. A silicon oxide layer 6, is next deposited using either LPCVD or PECVD procedures, at a temperature between about 350 to 750° C., to a thickness between about 500 to 3000 Angstroms, using tetraethylorthosilicate, (TEOS), as a source. Conventional photolithographic and reactive ion etching, (RIE), procedures, using CHF$_3$ as an etchant for silicon oxide layer 6, and gate insulator 4, and using Cl$_2$ as an etchant for polysilicon or polycide layer 5, are used to create silicon oxide capped, gate structures 7a and 7b, schematically shown in the top view of FIG. 2A, and for the cross-sectional view of FIG. 2B. Photoresist removal is again accomplished using plasma oxygen ashing and careful wet cleans. Gate structure 7b, overlying buried contact region 3, will be subsequently used for a butted contact structure, while gate structures 7a, will be used as a component of subsequent MOSFET devices.

Figure 3:
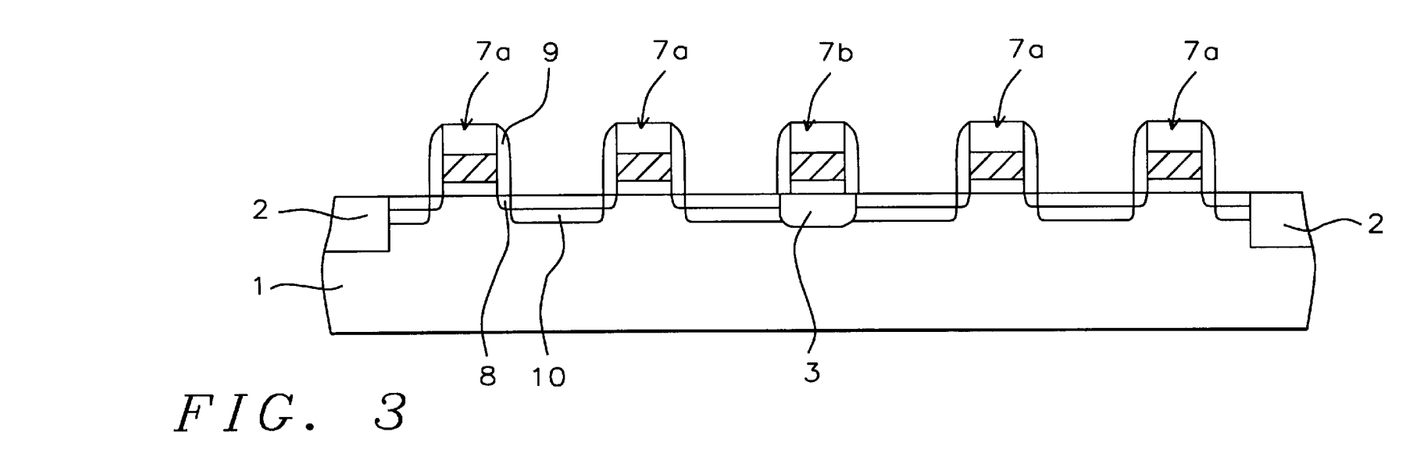
Figure 4:
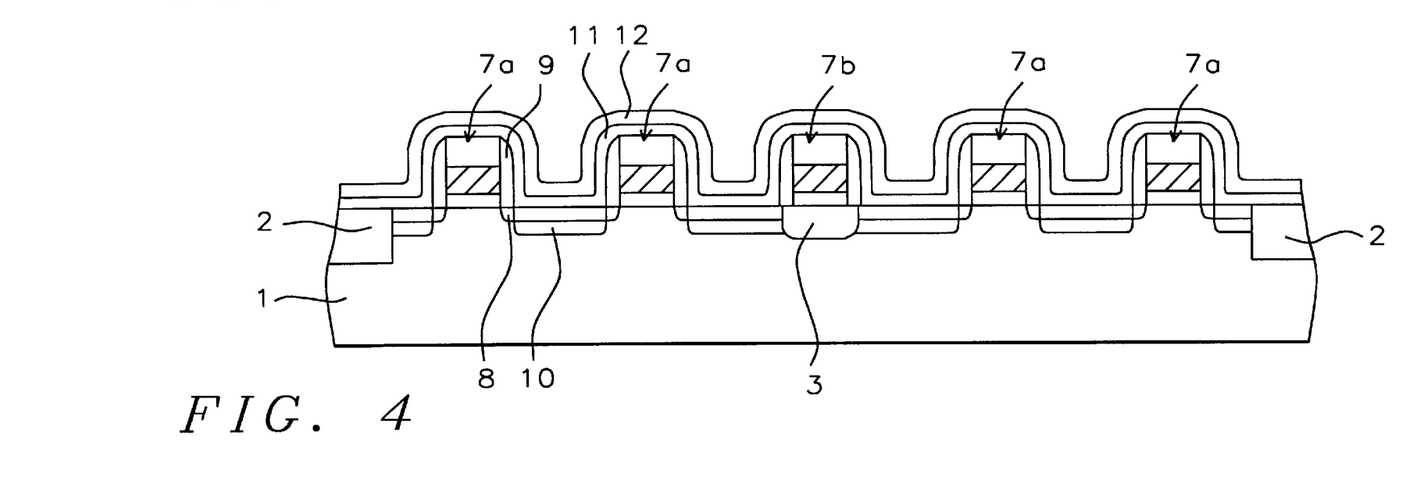

Lightly doped source/drain regions 8, are next created via ion implantation of phosphorous or arsenic, at an energy between about 25 to 75 KeV, at a dose between about 5E11 to 5E13 atoms/cm$^2$. Another silicon oxide layer is deposited, again via use of either LPCVD or PECVD procedures, at a temperature between about 350 to 750° C., to a thickness between about 1500 to 4000 Angstroms, using TEOS as a source, followed by an anisotropic RIE procedure, using CHF$_3$ as an etchant, to create insulator spacers 9, on the sides of gate structures 7a and 7b. Insulator spacers 8, can also be comprised of silicon nitride. Heavily doped source/drain regions 10, are then produced via ion implantation of either arsenic or phosphorous, at an energy between about 30 to 100 KeV, at a dose between about 1E14 to 1E16 atoms/cm$^2$. The result of these procedures is schematically shown in FIG. 3. A silicon nitride layer 11, is next deposited, via LPCVD or PECVD procedures, to a thickness between about 200 to 700 Angstroms, followed by the deposition of a first inter-poly oxide, (IPO), layer 12, comprised of silicon oxide, obtained via an LPCVD or a PECVD procedure, at a thickness between about 1000 to 2000 Angstroms, using TEOS as a source. The result of these depositions is schematically shown in FIG. 4.

Figure 5:
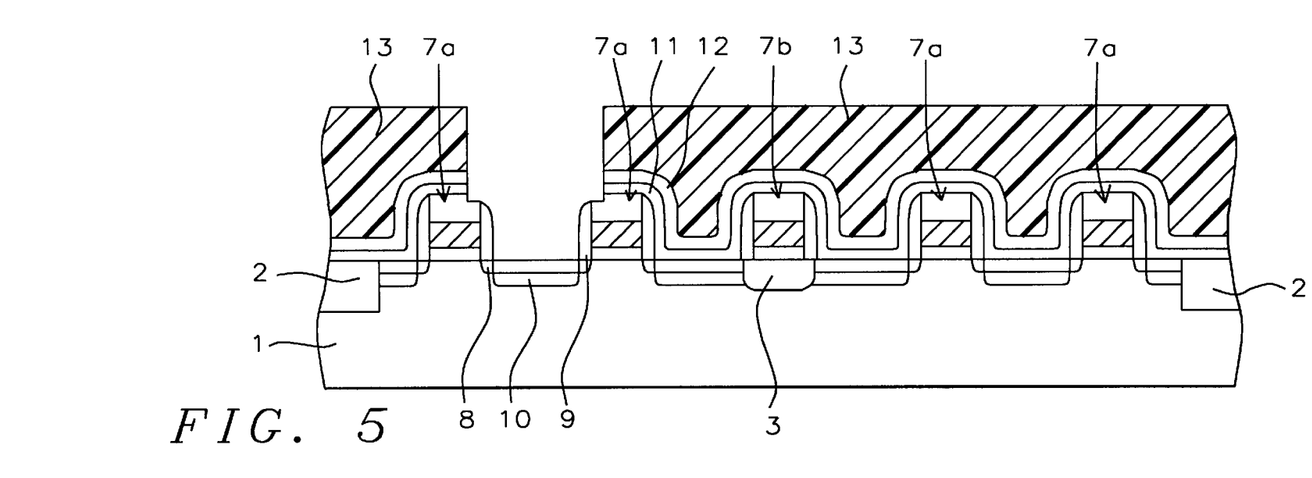

FIG. 5, schematically shows the creation of the first self-aligned contact, (SAC), opening, 14. Photoresist shape 13, is formed, followed by the definition of the first SAC opening 14, via an initial anisotropic RIE procedure, using CHF$_3$ as an etchant for first IPO layer 12, stopping on underlying silicon nitride layer 11, followed by another anisotropic RIE procedure, using Cl$_2$ as an etchant for silicon nitride layer 11, completing the formation of SAC opening 14. The Cl$_2$ RIE procedure stops on capping silicon oxide layer 6, of the gate structures, and also stops on silicon oxide spacers 9, thus exposing heavily doped source/drain regions 10, located between gate structures 7a and 7b. SAC opening 14, used in place of contact or via holes, and larger in width than the space between the gate structures, allows the space between gate structures to be maintained at a minimum dimension, thus allowing denser SRAM designs to be realized.

Figure 6:
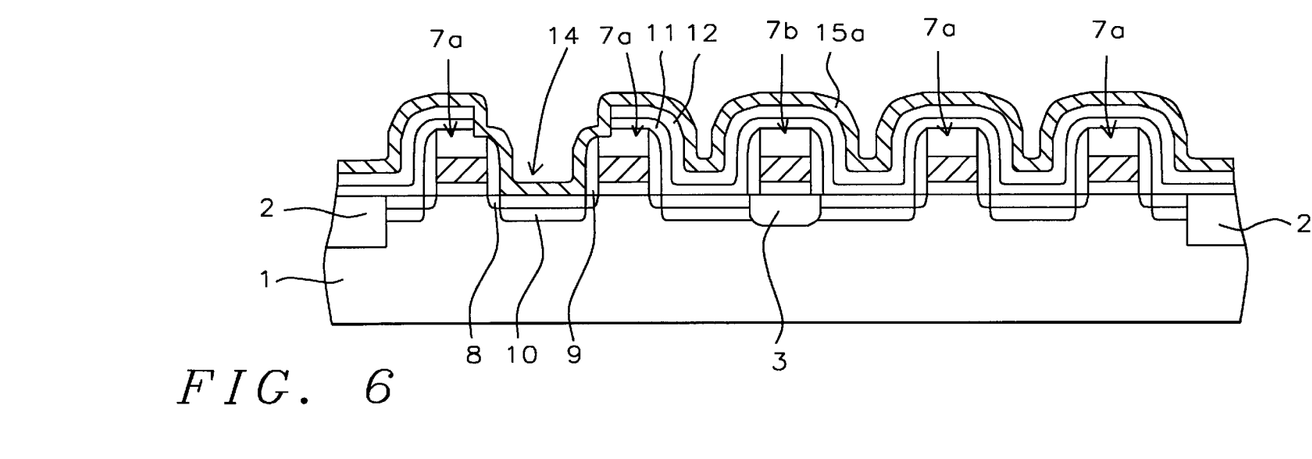
Figure 7A:
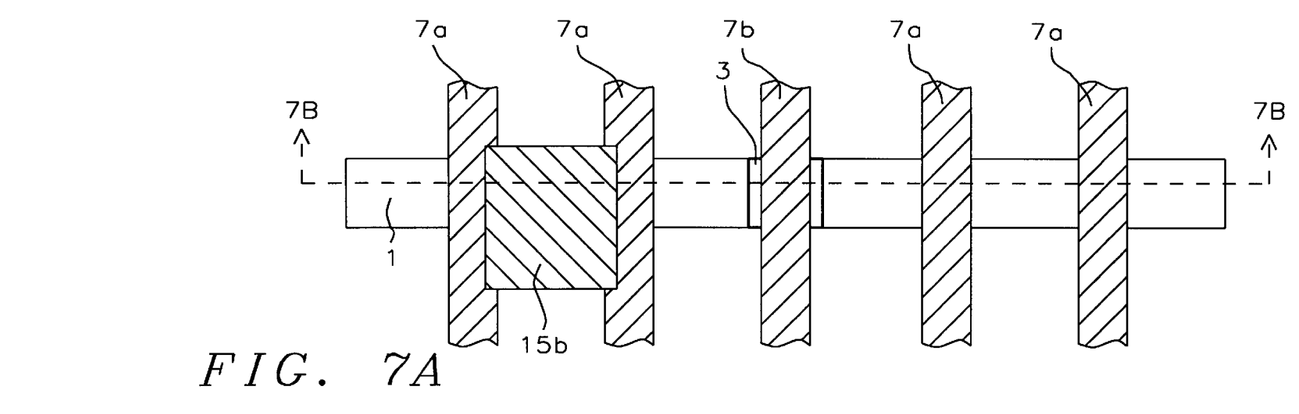
Figure 7B:
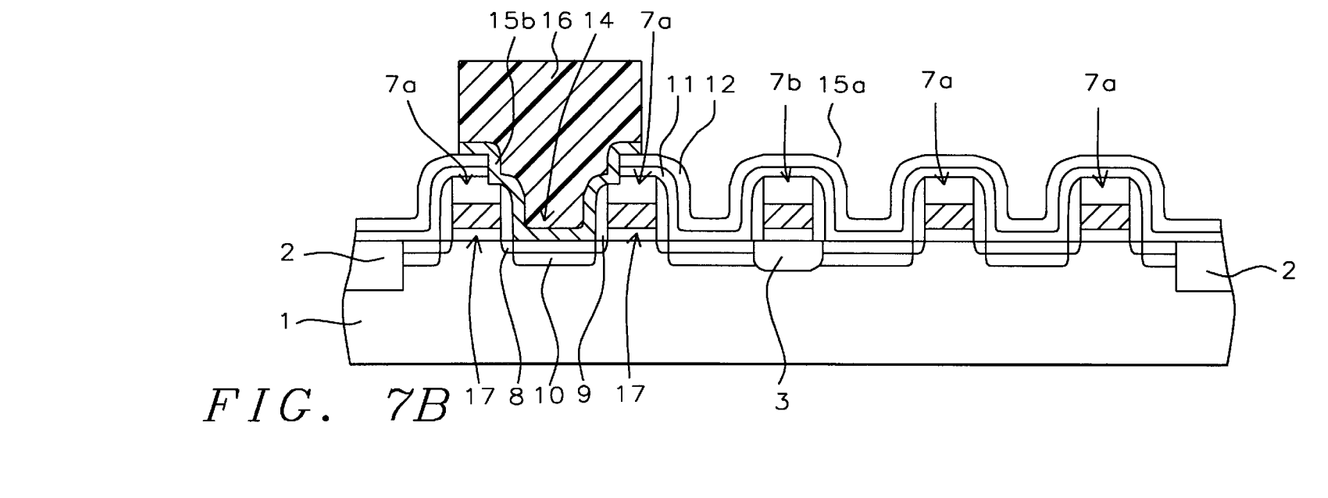

After removal of photoresist shape 13, via plasma oxygen ashing and careful wet cleans, polycide layer 15a, shown schematically in FIG. 6, is deposited. Polycide layer 15a, is comprised of an underlying polysilicon layer, deposited using an LPCVD procedure, to a thickness between about 500 to 600 Angstroms, and in situ doped during the LPCVD procedure, via the addition of arsine, or phosphine, to a silane ambient. Polycide layer 15a, is also comprised of an overlying layer of tungsten silicide, obtained using LPCVD procedures, to a thickness between about 1000 to 1400 Angstroms. Photoresist shape 16, is then used as a mask to pattern polycide layer 15a, via an anisotropic RIE procedure, using Cl$_2$ as an etchant, creating SAC structure 15b, shown schematically in the top view of FIG. 7A, and in the cross-sectional view displayed in FIG. 7B. SAC structure 15b, overlying gate structures 7a, contacts the source region, of heavily doped source/drain regions 10. SAC structure 15b, is used for the vss power line in the memory array, and is located between pull down transistors 17, shown schematically in FIG. 7B.

Figure 8:
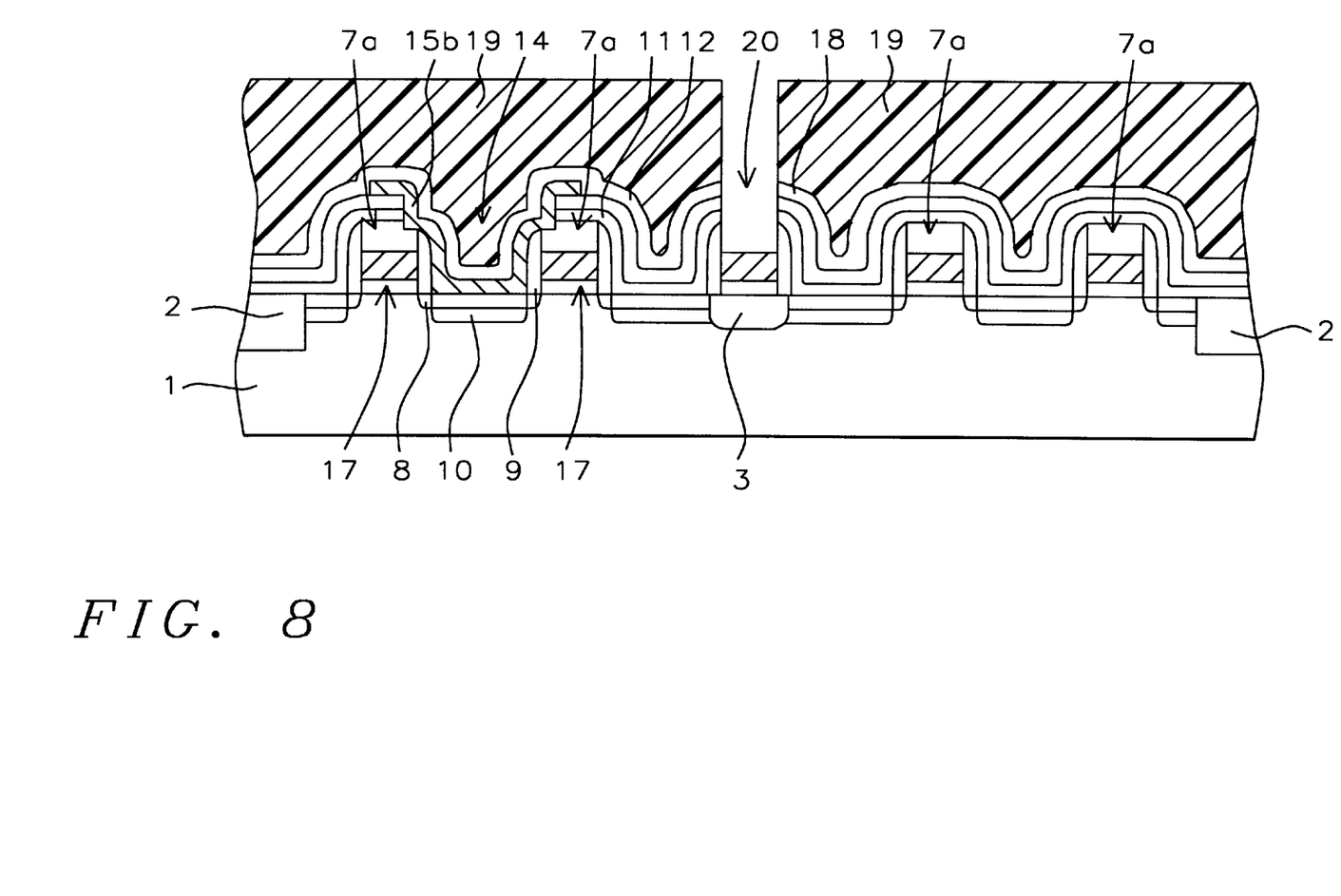
Figure 9:
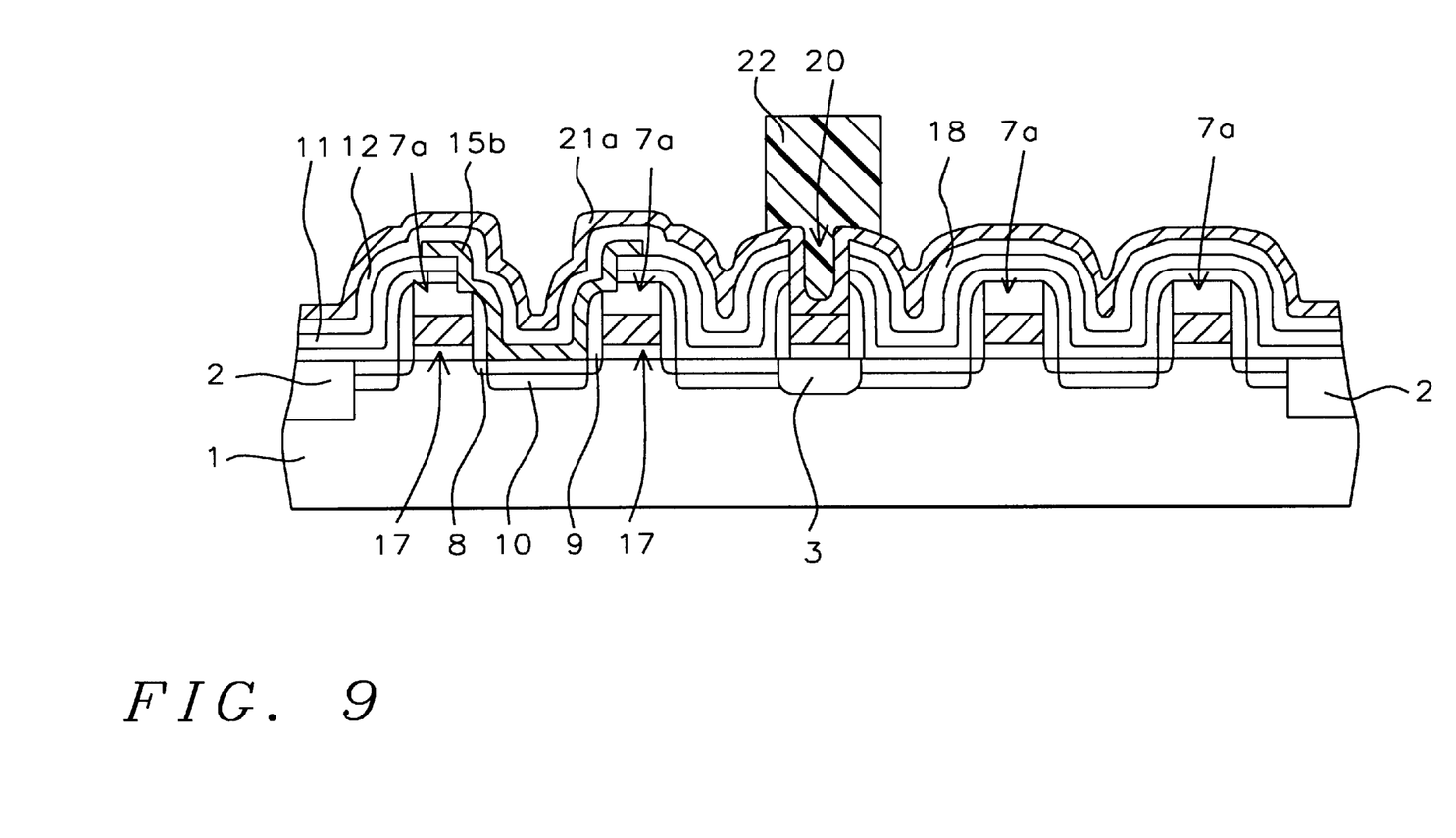
Figure 10:
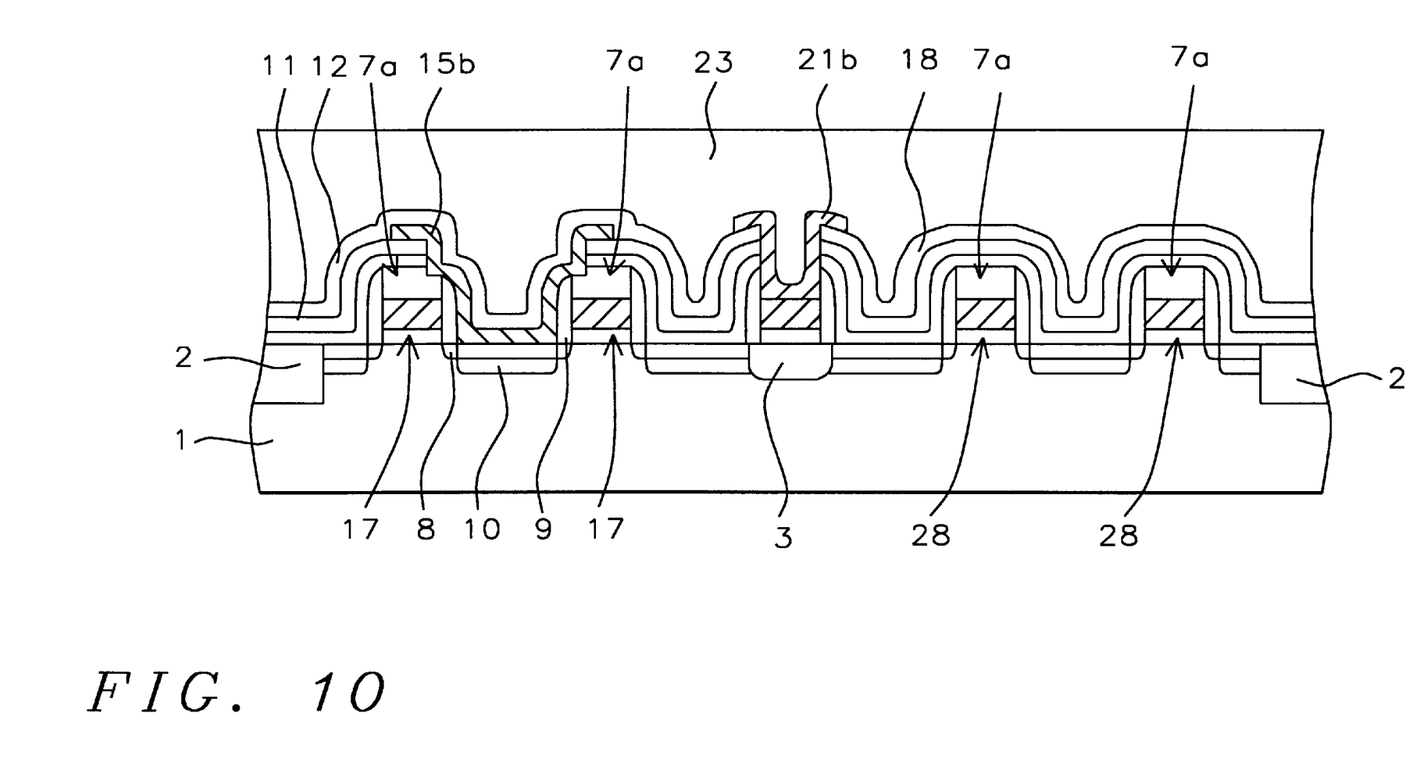

The formation of a butted contact structure, contacting gate structure 7b, is next addressed. A second IPO layer 18, comprised of silicon oxide, is deposited via LPCVD or PECVD procedures, at a thickness between about 1000 to 2000 Angstroms, using TEOS as a source. Photoresist shape 19, is formed, and used as a mask to allow butted contact opening 20, shown schematically in FIG. 8, to be created. Butted contact opening 20, is formed via an anisotropic RIE procedure, using $CHF_3$ as an etchant for second IPO layer 18, and for silicon oxide layer 12, then using $Cl_2$ as an etchant for silicon nitride layer 11, and again using $CHF_3$ as an etchant for silicon oxide layer 6, exposing polysilicon or polycide layer 5, of gate structure 7b. After removal of photoresist shape 19, via plasma oxygen ashing and careful wet cleans, undoped polysilicon layer 21a, is deposited using LPCVD procedures, to a thickness between about 500 to 600 Angstroms. Photoresist shape 22, shown schematically in FIG. 9, is then formed, to be used as a mask for subsequent patterning of polysilicon layer 21a. FIG. 10, schematically shows the result of the anisotropic RIE procedure, using $Cl_2$ as an etchant, creating polysilicon load resistor 21b. Polysilicon load resistor 21b, comprised with the butted contact structure, connects polysilicon load resistor 21b, via use of buried contact region 3, to active device regions of pull down transistor 17, and to active device regions of pass gate transistors 28. Another polysilicon load resistor, not shown in the drawings, is also formed via patterning of polysilicon layer 21a. After removal of photoresist shape 22, via plasma oxygen ashing and careful wet cleans, an interlevel dielectric layer, (ILD), 23, is deposited. ILD layer 23, is comprised of of an underlying layer of silicon oxide, deposited using PECVD procedures, using TEOS as a source, to a thickness between about 1000 to 2000 Angstroms, and is also comprised of an overlying layer of boro-phosphosilicate glass, (BPSG), again deposited using PECVD procedures, to a thickness between about 3000 to 12000 Angstroms, using TEOS as a source, and with the addition of phosphine and diborane to the ambient, needed to create the overlying BPSG insulator layer. A reflow procedure, performed at a temperature between about 750 to 900° C., is employed to create a smooth top surface topology. The result of these procedures is again, schematically shown in FIG. 10.

Figure 11:
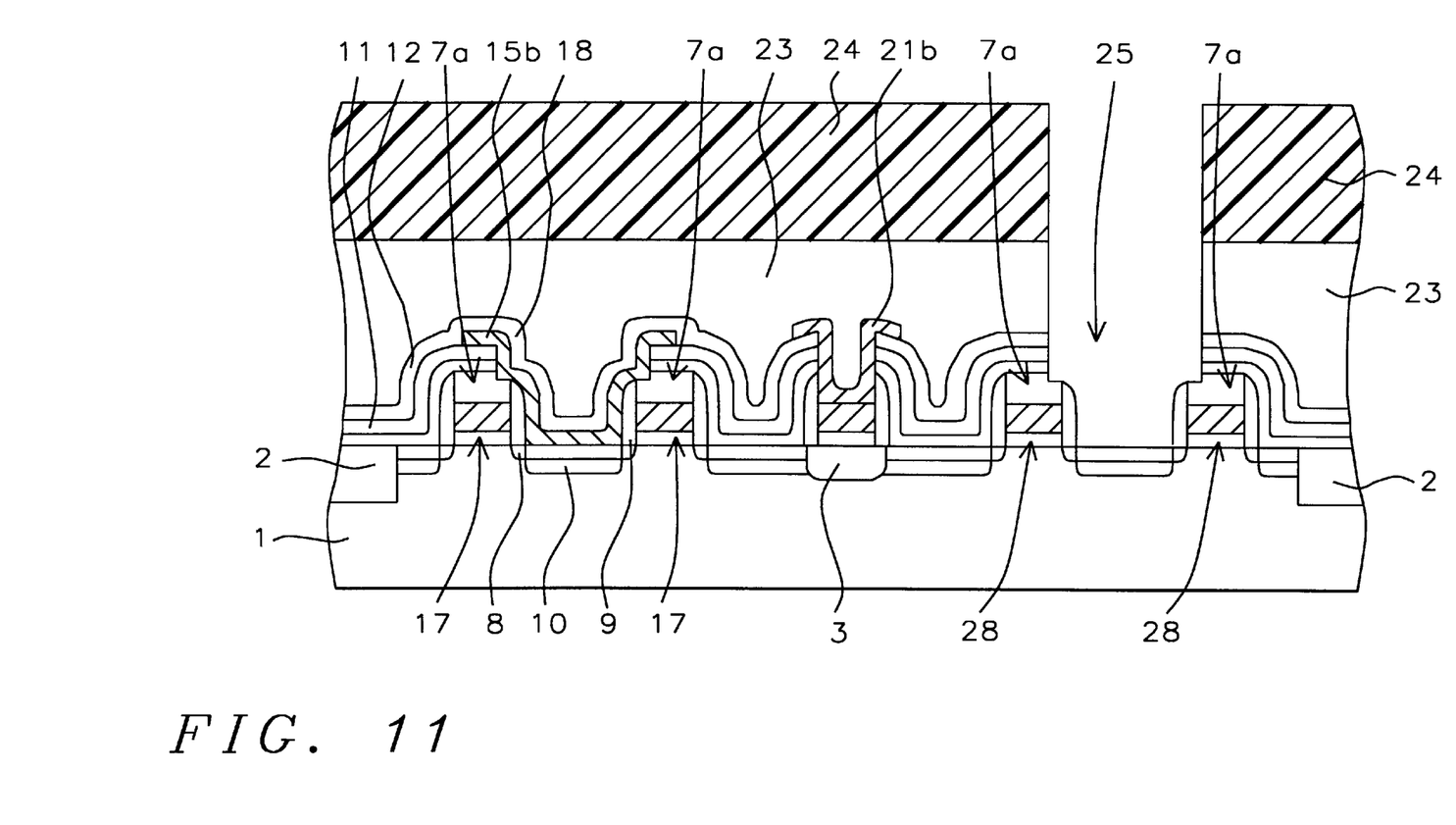

A second SAC opening 25, is next formed, using photoresist shape 24, as a mask, allowing an anisotropic RIE procedure, using $CHF_3$, as an etchant for ILD layer 23, for second IPO layer 18, and for silicon oxide layer 12, while $Cl_2$ is used as an etchant for silicon nitride layer 11, exposing the source region, of heavily doped source/drain region 10, of pass gate transistors 28. This is schematically shown in FIG. 11. Again as was the case for first SAC opening 14, second SAC opening 25, is larger in width than the space between gate structures 7b, thus allowing the use of a minimum space between gate structures 7b. Photoresist shape 24, is once again removed using plasma oxygen ashing and careful wet cleans.

Figure 12A:
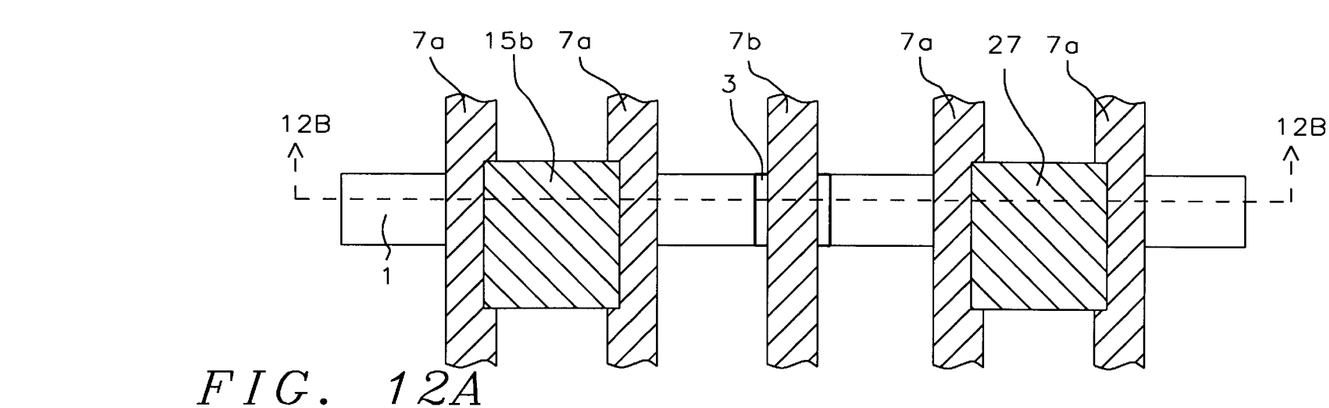
Figure 12B:
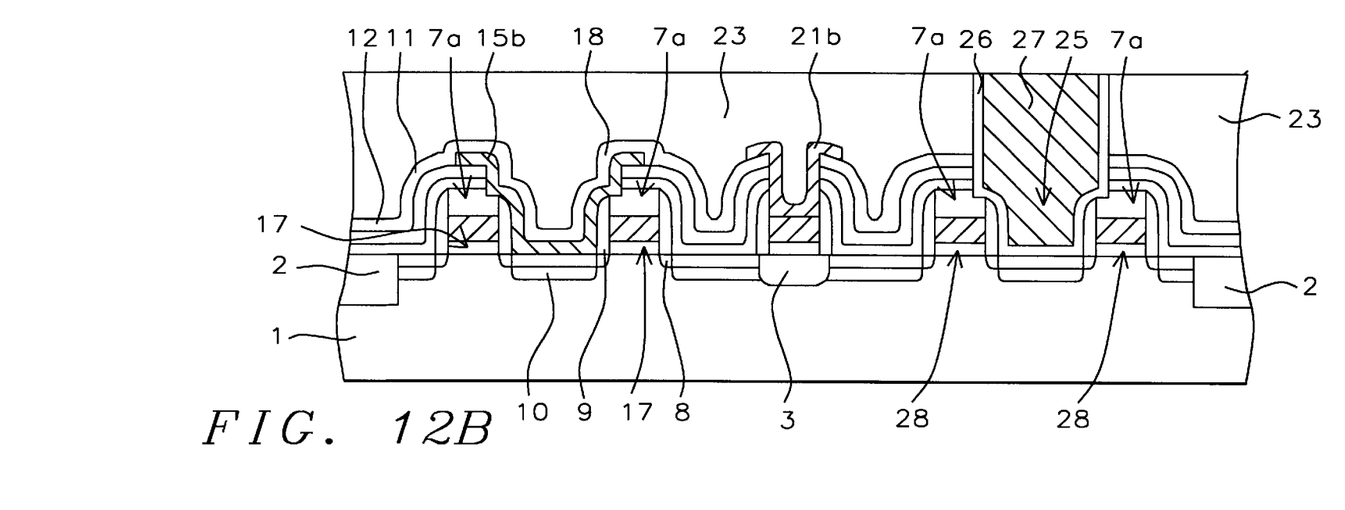
Figure 13:
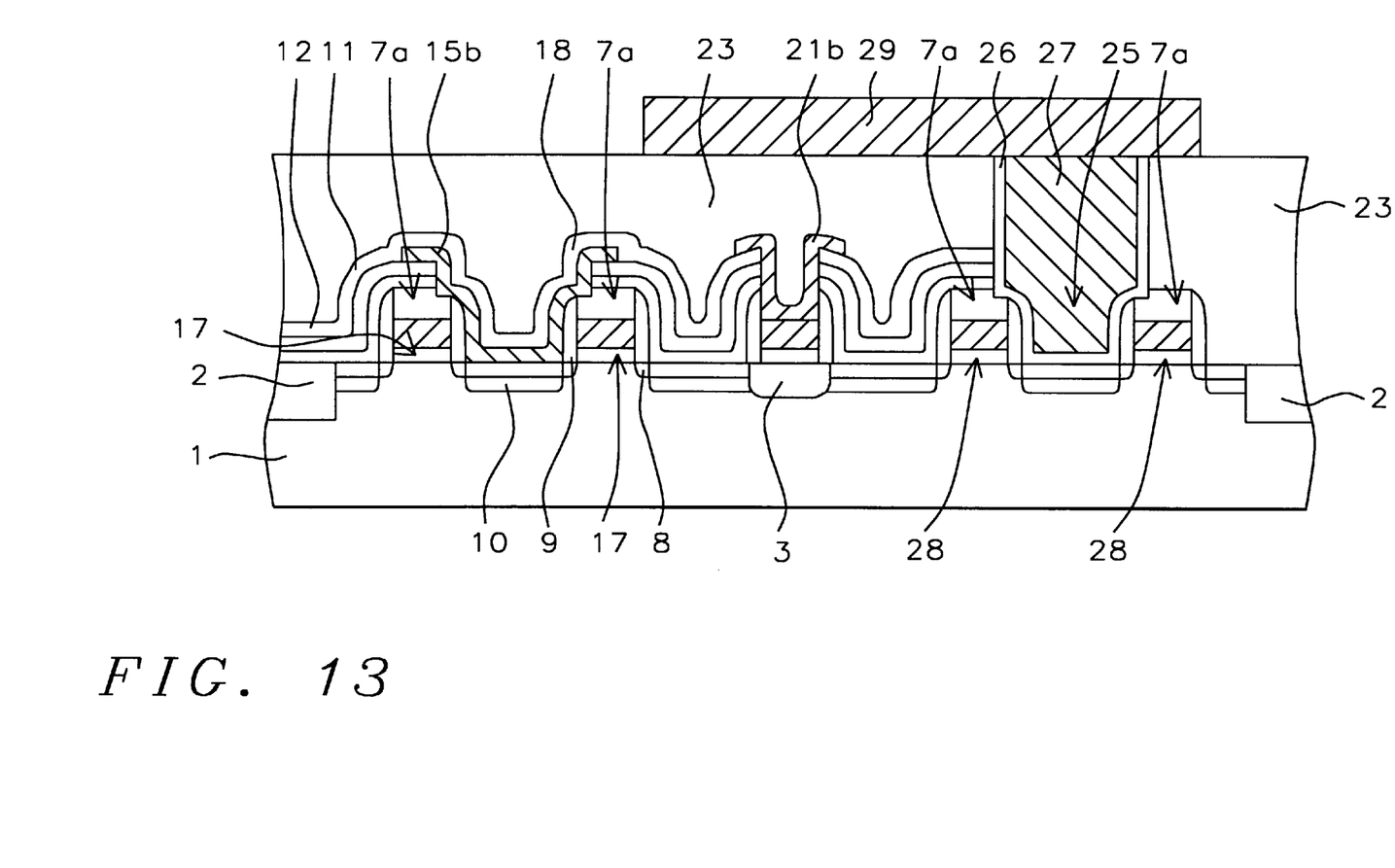

FIGS. 12A and 12B, schematically show the creation of second SAC structure 27. First an adhesive—barrier layer 26, comprised of an underlying titanium layer, and an overlying titanium nitride layer, are deposited using R.F. sputtering procedures. Next a tungsten layer 27, is deposited, via LPCVD or R.F. sputtering procedures, completely filling second SAC opening 25. Unwanted material, on the top surface of ILD layer 23, is then removed using either an anisotropic RIE procedure, using $Cl_2$ as an etchant for both tungsten layer 27, and adhesive—barrier layer 26, or via a chemical mechanical polishing procedure. Second SAC structure 27, shown schematically in top view, FIG. 12A, and cross-sectional view 12B, serves as a plug allowing subsequent connection between an overlying bit line structure, and the underlying source region, of the pass gate transistor. Finally, an interconnect metal layer, comprised of aluminum, with between about 0 to 2 weight % copper, is next deposited, via R.F. sputtering, to thickness between about 2000 to 6000 Angstroms. Photolithographic and anisotropic RIE procedures, using $Cl_2$ as an etchant, are used to form metal interconnect structure 29, overlying and contacting, second SAC structure 27.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a static random access memory, (SRAM), cell, on a semiconductor substrate, comprising the steps of:

providing isolation regions in said semiconductor substrate;

forming a buried contact region, in a first region of said semiconductor substrate;

forming two pull down, metal oxide semiconductor field effect transistors, (MOSFET), devices, on a second region of said semiconductor substrate, with each pull down MOSFET device comprised of an insulator capped, gate structure, overlying a gate insulator layer, and with a first source/drain region, in said second region of said semiconductor substrate, located between the insulator capped, gate structures of said pull down MOSFET devices;

forming two pass gate, MOSFET devices, on a third region of said semiconductor substrate, with each pass gate MOSFET device comprised of an insulator capped, gate structure, overlying said gate insulator layer, and with a second source/drain region, in said third region of said semiconductor substrate, located between the insulator capped, gate structures of said pass gate MOSFET devices;

forming an insulator capped, gate structure, on said gate insulator layer, with said insulator capped, gate structure overlying said buried contact region, and with a third and a fourth source/drain region, in said first region of said semiconductor substrate, located on each side of said insulator capped, gate structure;

forming a first self-aligned contact, (SAC), opening, in a first interlevel insulator layer, between insulator capped, gate structures, of said pull down MOSFET devices, and with said SAC opening, exposing a source region, of said first source/drain region;

forming a first self-aligned contact, (SAC), structure in said SAC opening, contacting said source region, of said first source/drain region;

depositing a second interlevel insulator layer;

forming a butted contact opening in said second insulator layer, in said first insulator layer, and in the capping insulator layer, exposing the top surface of the gate structure that overlays said buried contact region, in said first region of said semiconductor substrate;

forming polysilicon load resistor, comprised with a polysilicon butted contact structure, in said butted contact opening;

depositing a third interlevel insulator layer;

forming a second SAC opening, in said third interlevel insulator layer, in said second interlevel insulator layer, and in said first interlevel insulator layer, with said second SAC opening located between insulator capped gate structures of said pass gate MOSFET devices, exposing a source region of said second source/drain region;

forming a second SAC structure, in said second SAC opening, contacting said source region of said second source/drain region; and forming a metal interconnect structure, overlying and contacting said second SAC structure.

2. The method of claim 1, wherein said buried contact region is formed via ion implantation of arsenic or phosphorous, at an energy between about 30 to 100 KeV, at a dose between about 1E14 to 3E15 atoms/cm$^2$.

3. The method of claim 1, wherein the insulator layer used for said insulator capped, gate structures, is a silicon oxide layer, deposited using LPCVD or PECVD procedures, to a thickness between about 500 to 3000 Angstroms.

4. The method of claim 1, wherein the layer used for the gate structures, for said insulator capped, gate structures, is either a polycide layer, comprised of an overlying tungsten silicide layer, on an underlying polysilicon layer, or the layer used for the gate structure, of said insulator capped, gate structures, is polysilicon, at a thickness between about 500 to 1500 Angstroms.

5. The method of claim 1, wherein source regions, of source/drain regions, are formed via ion implantation of arsenic or phosphorous, at an energy between about 30 to 100 KeV, at a dose between about 1E14 to 1E16 atoms/cm$^2$.

6. The method of claim 1, wherein said first interlevel insulator layer is a composite insulator layer, comprised of an overlying silicon oxide layer, obtained via PECVD or LPCVD procedures, at a thickness between about 1000 to 2000 Angstroms, using TEOS as a source, and comprised of an underlying silicon nitride layer, obtained using LPCVD or PECVD procedures, at a thickness between about 200 to 700 Angstroms.

7. The method of claim 1, wherein said first SAC opening is formed in said first interlevel insulator layer, via an anisotropic RIE procedure, using CHF$_3$ as an etchant for silicon oxide, and using Cl$_2$ as an etchant for silicon nitride.

8. The method of claim 1, wherein said first SAC structure is a polycide structure, comprised of an overlying tungsten silicide layer, at a thickness between about 1000 to 1400 Angstroms, and an underlying in situ doped, polysilicon layer, at a thickness between about 500 to 600 Angstroms.

9. The method of claim 1, wherein said second interlevel insulator layer is silicon oxide, obtained using LPCVD or PECVD procedures, to a thickness between about 1000 to 2000 Angstroms, using TEOS as a source.

10. The method of claim 1, wherein said butted contact opening is formed in said second interlevel insulator layer, in said first interlevel insulator layer, and in the insulator layer used for said capping insulator, gate structures, via an anisotropic RIE procedure, using CHF$_3$ as an etchant for silicon oxide layers, while using Cl$_2$ as an etchant for the silicon nitride layer.

11. The method of claim 1, wherein said butted contact structure is formed from an undoped polysilicon layer, at a thickness between about 500 to 600 Angstroms.

12. The method of claim 1, wherein said third interlevel insulator layer is a composite insulator layer, comprised of: an underlying silicon oxide layer, deposited via PECVD procedures, to a thickness between about 1000 to 2000 Angstroms, using TEOS as a source, and comprised of an overlying boro-phosphosilicate glass, (BPSG), layer, deposited using PECVD procedures, to a thickness between about 3000 to 12000 Angstroms, using TEOS as a source, with the addition of phosphine and diborane dopants.

13. The method of claim 1, wherein said second SAC opening, in said third interlevel insulator layer, in said second interlevel insulator layer, and in said first interlevel insulator layer, is created via an anisotropic RIE procedure, using CHF$_3$ as an etchant for silicon oxide and BPSG layers, while Cl$_2$ is used as an etchant for said silicon nitride layer.

14. The method of claim 1, wherein said second SAC structure, in said second SAC opening, is comprised of tungsten plug, obtained via LPCVD or R.F. sputtering procedures.

15. A method for fabricating an SRAM cell, on a semiconductor substrate, with said SRAM cell featuring two self-aligned contact, (SAC), structures, a butted contact structure, and a buried contact region, comprising the steps of:

forming insulator filled shallow trench isolation regions in said semiconductor substrate;

forming said buried contact region in a first region of said semiconductor substrate;

growing a silicon dioxide gate insulator layer on said semiconductor substrate;

forming a polycide layer on said silicon dioxide gate insulator layer;

depositing a first silicon oxide layer on said polycide layer;

patterning of said first silicon oxide layer, of said polycide layer, and of said silicon dioxide gate insulator layer, to form two silicon oxide capped, polycide gate structures, for SRAM, pull down MOSFET devices, overlying a second region of said semiconductor substrate;

patterning of said first silicon oxide layer, of said polycide layer, and of said silicon dioxide gate insulator layer, to form two silicon oxide capped, polycide gate structures, for SRAM pass gate MOSFET devices, overlying said third region of said semiconductor substrate;

patterning of said first silicon oxide layer, of said polycide layer, and of said silicon dioxide gate insulator layer, to form a silicon oxide capped, polycide gate structure, overlying said buried contact region, in said first region of said semiconductor substrate;

forming lightly doped source/drain regions, in regions of said semiconductor substrate not covered by the silicon oxide capped, polycide gate structures;

forming silicon oxide spacers on the sides of said silicon oxide capped, polycide gate structures;

forming heavily doped source/drain regions, in regions of said semiconductor substrate not covered by said silicon oxide capped, polycide gate structures, and not covered by said silicon oxide spacers;

depositing a silicon nitride layer;

depositing a second silicon oxide layer;

forming a first SAC opening, in said second silicon oxide layer, and in said silicon nitride layer, exposing a first source region, of a heavily doped source/drain region, located between the two silicon oxide capped, polycide gate structures, used for said SRAM pull down MOSFET devices;

forming a polycide SAC structure, in said first SAC opening, contacting said first source region, located between the two silicon oxide capped, polycide gate structures, used for said SRAM pull down MOSFET devices;

depositing a third silicon oxide layer;

forming a butted contact opening in said third silicon oxide layer, in said second silicon oxide layer, in said silicon nitride layer, and in said first silicon oxide layer, exposing the top surface of the polycide layer, used as part of said silicon oxide capped, polycide gate structure, with said butted contact opening overlying said buried contact region, in said first region of said semiconductor substrate;

forming a SRAM polysilicon load resistor, comprised of a polysilicon butted contact structure, in said butted contact opening;

depositing a composite insulator layer;

reflowing of said composite insulator layer;

forming a second SAC opening, in said composite insulator layer, in said third silicon oxide layer, in said second silicon oxide layer, and in said silicon nitride layer, exposing a second source region, of a heavily doped source/drain region, located between the two silicon oxide capped, polycide gate structures, used for said SRAM pass gate MOSFET devices;

depositing a tungsten layer, completely filling said second SAC opening;

patterning of said tungsten layer to form a tungsten SAC structure, in said second SAC opening; and forming a metal interconnect structure, overlying and contacting said tungsten SAC structure.

16. The method of claim 15, wherein said buried contact region is formed via ion implantation of arsenic or phosphorous, at an energy between about 30 to 100 KeV, and at a dose between about 1E14 to 3E15 atoms/cm$^2$.

17. The method of claim 15, wherein said silicon dioxide gate insulator layer is thermally grown, in an oxygen—steam ambient, to a thickness between about 35 to 200 Angstroms.

18. The method of claim 15, wherein said first silicon oxide layer, used as a component of said silicon oxide capped, polycide gate structure, is deposited using LPCVD or PECVD procedures, to a thickness between about 500 to 1500 Angstroms.

19. The method of claim 15, wherein said silicon nitride layer is deposited using LPCVD or PECVD procedures, to a thickness between about 200 to 700 Angstroms.

20. The method of claim 15, wherein said second silicon oxide layer is deposited using PECVD or LPCVD procedures, to a thickness between about 1000 to 2000 Angstroms, using TEOS as a source.

21. The method of claim 15, wherein said first SAC opening is formed via an anisotropic RIE procedure, using CHF$_3$ as an etchant for said second silicon oxide layer, and using Cl$_2$ as an etchant for said silicon nitride layer.

22. The method of claim 15, wherein said polycide SAC structure is comprised of an overlying layer of tungsten silicide, obtained using LPCVD procedures, at a thickness between about 1000 to 1400 Angstroms, and an underlying layer of in situ doped polysilicon, obtained using LPCVD procedures, at a thickness between about 500 to 600 Angstroms.

23. The method of claim 15, wherein said polycide SAC structure is formed via an anisotropic RIE procedure, using Cl$_2$ as an etchant for a tungsten silicide layer, and as an etchant for a polysilicon layer.

24. The method of claim 15, wherein said third silicon oxide layer is obtained using LPCVD or PECVD procedures, to a thickness between about 1000 to 2000 Angstroms, using TEOS as a source.

25. The method of claim 15, wherein said butted contact opening is formed via an anisotropic procedure, using CHF$_3$ as an etchant for said third silicon oxide layer, as an etchant for said second silicon oxide layer, and as an etchant for said first silicon oxide layer, while using Cl$_2$ as an etchant for said silicon nitride layer.

26. The method of claim 15, wherein said polysilicon load resistor is comprised of an undoped polysilicon layer, obtained via LPCVD procedures, at a thickness between about 500 to 600 Angstroms.

27. The method of claim 15, wherein said polysilicon butted contact structure is formed via an anisotropic RIE procedure, applied to an undoped polysilicon layer, using Cl$_2$ as an etchant.

28. The method of claim 15, wherein said composite insulator layer is comprised of an underlying silicon oxide layer, deposited using PECVD procedures, to a thickness between about 1000 to 2000 Angstroms, using TEOS as a source, and comprised of an overlying borophosphosilicate glass layer, deposited using PECVD procedures, to a thickness between about 3000 to 12000 Angstroms, using TEOS as a source with the addition of phosphine and diborane dopants.

29. The method of claim 15, wherein reflowing of said composite insulator layer is performed at a temperature between about 750 to 900° C.

30. The method of claim 15, wherein said second SAC opening is performed via an anisotropic RIE procedure, using CHF$_3$, as an etchant for said composite insulator layer, for said third silicon oxide layer, and for said second silicon oxide layer, while Cl$_2$ is used as an etchant for said silicon nitride layer.

31. The method of claim 15, wherein said tungsten SAC structure is comprised of a tungsten layer, obtained via LPCVD or R.F. sputtering procedures, and wherein said tungsten SAC structure is formed via patterning of said tungsten layer, via an anisotropic RIE procedure, using Cl$_2$ as an etchant, or via a chemical mechanical polishing procedure.

* * * * *